US007821086B2

(12) United States Patent
Kajiyama

(10) Patent No.: US 7,821,086 B2
(45) Date of Patent: Oct. 26, 2010

(54) SEMICONDUCTOR MEMORY DEVICE

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 909 days.

(21) Appl. No.: 11/563,420

(22) Filed: Nov. 27, 2006

(65) Prior Publication Data
US 2007/0164265 A1 Jul. 19, 2007

(30) Foreign Application Priority Data
Jan. 19, 2006 (JP) ............... 2006-011502

(51) Int. Cl.
*H01L 29/82* (2006.01)
(52) U.S. Cl. ............. 257/421; 257/506; 257/522; 257/E21.54; 257/E29.323
(58) Field of Classification Search .......... 257/421, 257/506, 508, 522, E23.11, E29.323, E21.54
See application file for complete search history.

(56) References Cited

U.S. PATENT DOCUMENTS

| 6,518,588 | B1* | 2/2003 | Parkin et al. ............ 257/3 |
| 2003/0003647 | A1* | 1/2003 | Dennison et al. .......... 438/238 |
| 2005/0036361 | A1* | 2/2005 | Fukuzumi ............... 365/158 |
| 2007/0096248 | A1* | 5/2007 | Philipp et al. ............ 257/528 |
| 2007/0099377 | A1* | 5/2007 | Happ et al. ............. 438/257 |
| 2007/0108430 | A1* | 5/2007 | Lung .................... 257/4 |
| 2007/0109836 | A1* | 5/2007 | Lung ................... 365/148 |
| 2007/0181932 | A1* | 8/2007 | Happ et al. ............ 257/314 |
| 2008/0017842 | A1* | 1/2008 | Happ et al. ............... 257/4 |
| 2008/0099791 | A1* | 5/2008 | Lung ................... 257/213 |
| 2008/0116442 | A1* | 5/2008 | Nirschl et al. .............. 257/4 |

FOREIGN PATENT DOCUMENTS

JP 2003-298025 10/2003

OTHER PUBLICATIONS

M. Motoyoshi, et al., "A study for 0.18um High-Density MRAM", 2004 Symposium on VLSI Technology Digest of Technical Papers, IEEE, 2004, pp. 22-23.
H. Hosomi, et al., "A Novel Nonvolatile Memory with Spin Torque Transfer Magnetization Swithching: Spin-RAM", IEDM Technical Digest, 473, IEEE, 2005, 4 pages.

* cited by examiner

*Primary Examiner*—David Vu
*Assistant Examiner*—Earl N Taylor
(74) *Attorney, Agent, or Firm*—Oblon, Spivak, McClelland, Maier & Neustadt, L.L.P.

(57) ABSTRACT

A semiconductor memory device includes a first write line which is provided in a first direction, a first memory element which is connected to the first write line, a second memory element which is provided to neighbor the first memory element in the first direction, and is connected to the first write line, a first insulation film which is provided on surfaces of the first and second memory elements, and a second insulation film which is provided between the neighboring first and second memory elements and has a lower heat conductivity than the first insulation film.

11 Claims, 10 Drawing Sheets

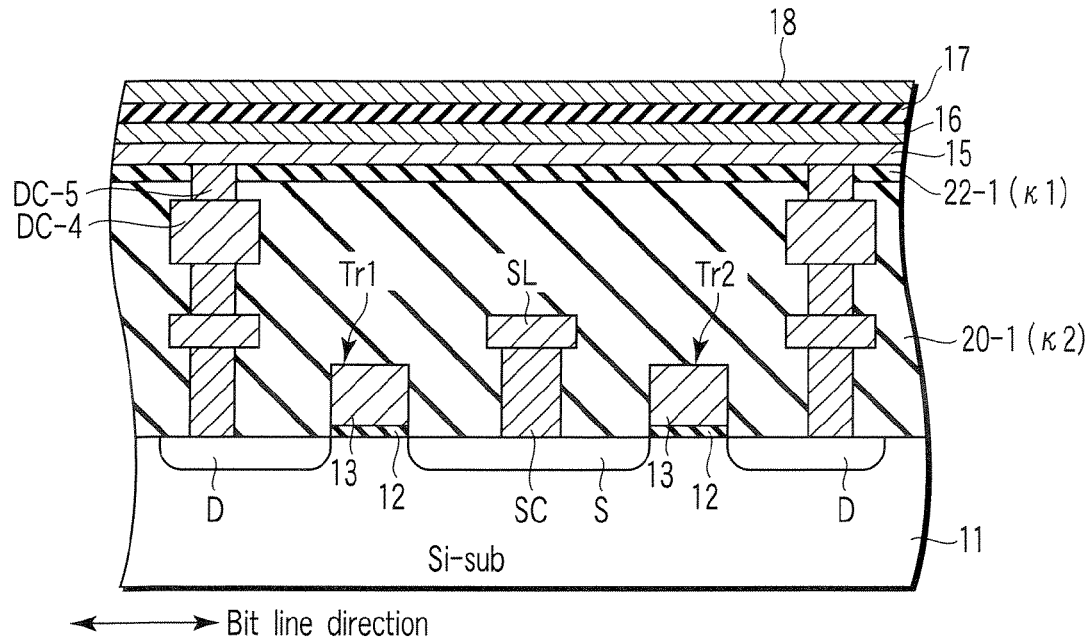
F I G. 3
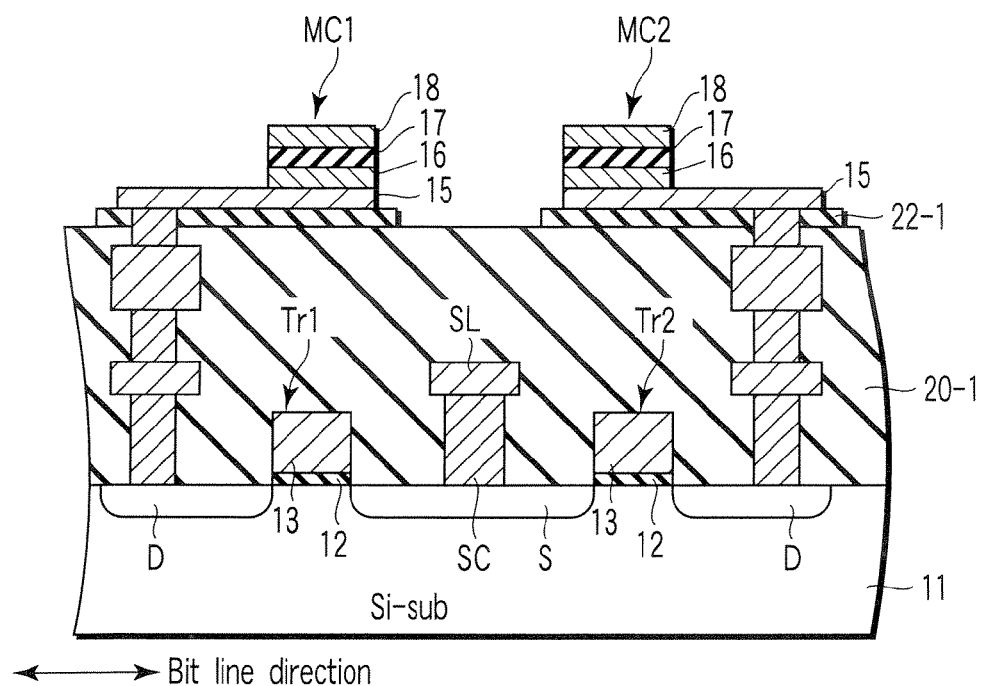
F I G. 4

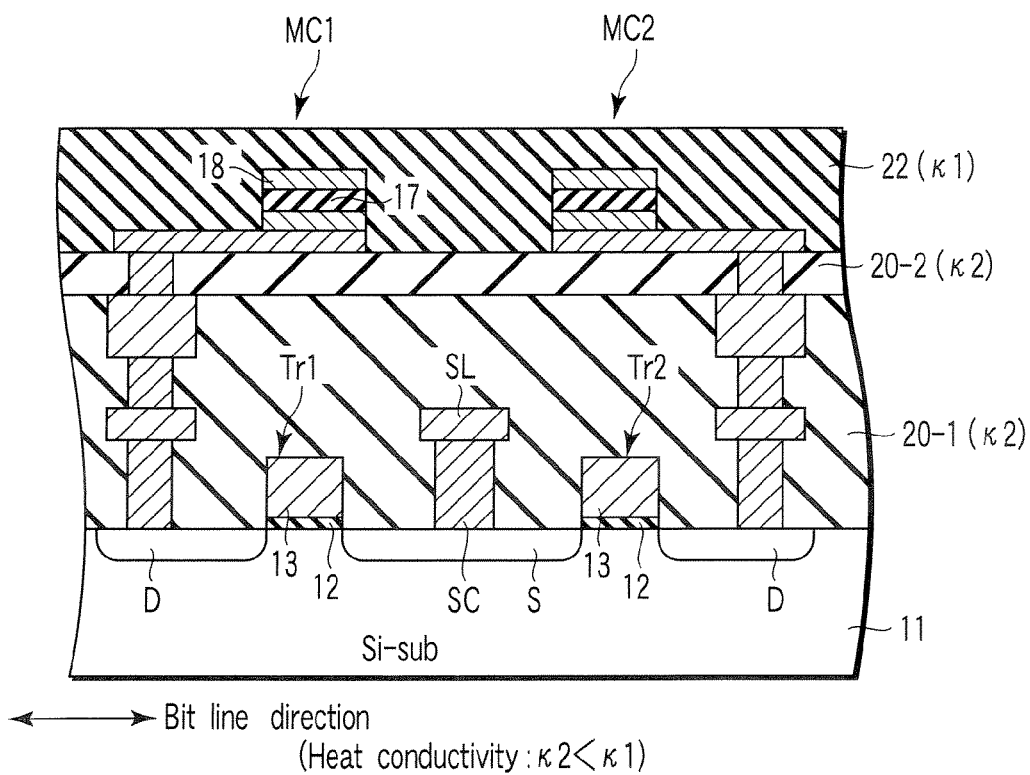
F I G. 12
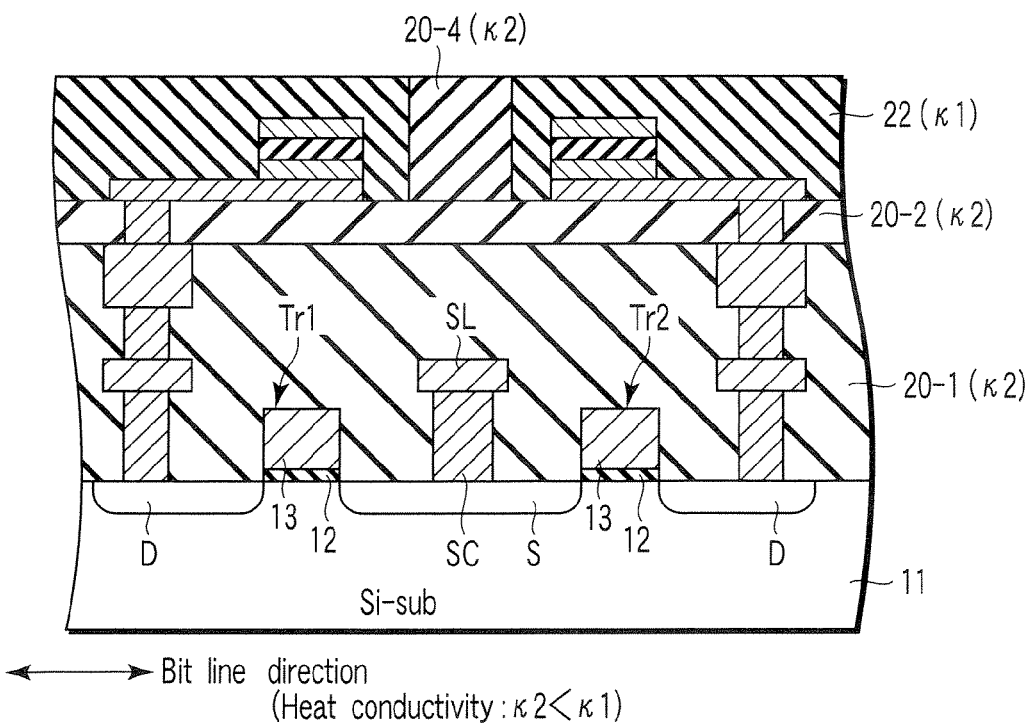
F I G. 13

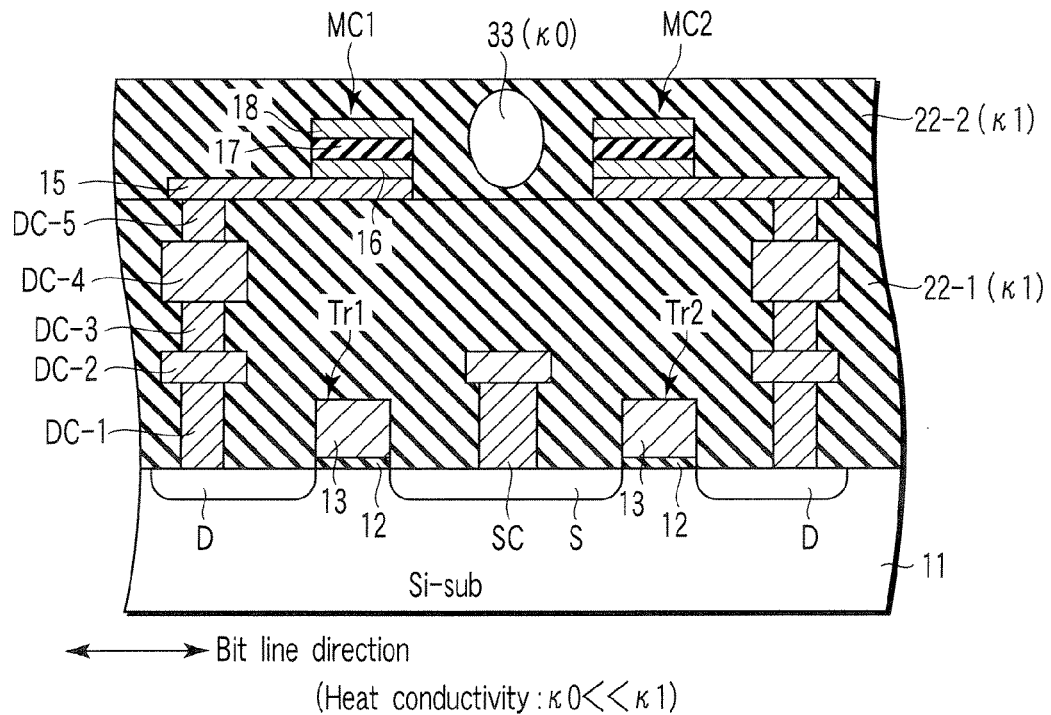
(Heat conductivity : $\kappa 0 \ll \kappa 1$)
F I G. 16
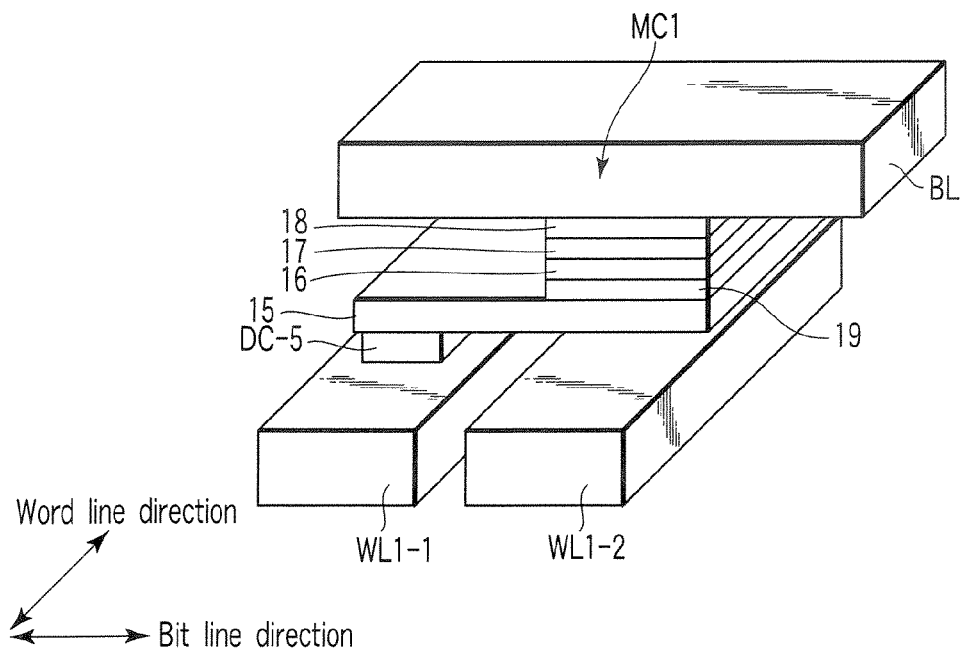
F I G. 17

SEMICONDUCTOR MEMORY DEVICE

CROSS-REFERENCE TO RELATED APPLICATIONS

This application is based upon and claims the benefit of priority from prior Japanese Patent Application No. 2006-011502, filed Jan. 19, 2006, the entire contents of which are incorporated herein by reference.

BACKGROUND OF THE INVENTION

1. Field of the Invention

The present invention relates to a semiconductor memory device, and is applied, for example, to an MRAM (magnetic random access memory).

2. Description of the Related Art

Conventionally, MRAMs that make use of a magnetoresistive effect of a ferromagnetic body have attracted attention more and more as next-generation solid nonvolatile memories that are capable of achieving high-speed read/write, an increase in capacity and an operation with low power consumption. In particular, MRAMs have attracted special attention since it was found that a magneto-resistance effect element with a magnetic tunnel junction (MTJ) has a high magneto-resistance variation ratio.

The magnetic tunnel junction has, as a basic structure, a three-layer stacked structure that comprises a free layer (magnetization free layer), the direction of magnetization of which is easily changed, a pinned layer (magnetization fixed layer) which is opposed to the free layer and maintains a predetermined direction of magnetization, and a tunneling barrier layer (insulation layer) which is interposed between the free layer and the pinned layer. In the magnetic tunnel junction, an electric current flows, tunneling through the tunneling barrier layer. At this time, the resistance of the junction varies in accordance with relative angles of the magnetization directions of the pinned layer and the free layer. When the magnetization directions are parallel, the resistance takes a minimum value. When the magnetization directions are antiparallel, the resistance takes a maximum value. This variation in resistance is called "tunneling magneto-resistance effect" (hereinafter referred to as "TMR effect"). In a case where a magnetic element having a magnetic tunnel junction is actually used as one memory cell of the MRAM, the parallel/antiparallel state (i.e. minimum/maximum resistance) of the magnetization directions of the pinned layer and free layer is associated with binary information "0" or "1", thus storing information.

In a write operation of magnetic information, only the magnetization direction of the free layer is reversed. In a read operation of magnetic information, a sense current is let to flow through the memory cell, and the variation in resistance due to the TMR effect is detected. The above-described magneto-resistance effect element that makes use of the above-described TMR effect is hereafter referred to as "MTJ element" (magnetic tunnel junction element).

In the meantime, as a greater number of MTJ elements are integrated in order to realize a giga-bit (G bit) class MRAM, a write current that is necessary for writing data in the MTJ elements increases accordingly.

If heat produced by the write current (hereinafter referred to as "current-passage heat") is conducted to a non-selected MTJ element, the spin of the non-selected MTJ element is reversed and erroneous write (disturb) occurs. It is thus necessary to prevent the current-passage heat from being conducted to the non-selected cell.

Moreover, if the current-passage heat remains in the selected cell for a long time after the completion of a write operation, the write speed would decrease. It is thus necessary to quickly radiate the current-passage heat from the selected cell immediately after the write operation.

On the other hand, in recent years, studies have been made of MRAMs of a write scheme in which only the magnetization direction of the free layer is reversed by making use of heat assistance of the current-passage heat to the memory cell (see, for instance, Jpn. Pat. Appln. KOKAI Publication No. 2003-298025).

BRIEF SUMMARY OF THE INVENTION

According to an aspect of the present invention, there is provided a semiconductor memory device comprising: a first write line which is provided in a first direction; a first memory element which is connected to the first write line; a second memory element which is provided to neighbor the first memory element in the first direction, and is connected to the first write line; a first insulation film which is provided on surfaces of the first and second memory elements; and a second insulation film which is provided between the neighboring first and second memory elements and has a lower heat conductivity than the first insulation film.

According to another aspect of the present invention, there is provided a semiconductor memory device comprising: a first write line which is provided in a first direction; a first memory element which is connected to the first write line; a second memory element which is provided to neighbor the first memory element in the first direction, and is connected to the first write line; an insulation film which is provided between the neighboring first and second memory elements; and an air gap which is provided in the insulation film and has a lower heat conductivity than the insulation film.

BRIEF DESCRIPTION OF THE SEVERAL VIEWS OF THE DRAWING

FIG. 3 is a cross-sectional view illustrating a fabrication step of the semiconductor memory device according to the first embodiment;

FIG. 4 is a cross-sectional view illustrating a fabrication step of the semiconductor memory device according to the first embodiment;

FIG. 12 is a cross-sectional view illustrating a fabrication step of the semiconductor memory device according to the second embodiment;

FIG. 13 is a cross-sectional view illustrating a fabrication step of the semiconductor memory device according to the second embodiment;

FIG. 16 is a cross-sectional view illustrating a fabrication step of the semiconductor memory device according to the third embodiment;

FIG. 17 is a cross-sectional view showing a semiconductor memory device according to a fourth embodiment of the present invention;

DETAILED DESCRIPTION OF THE INVENTION

Figure 1:
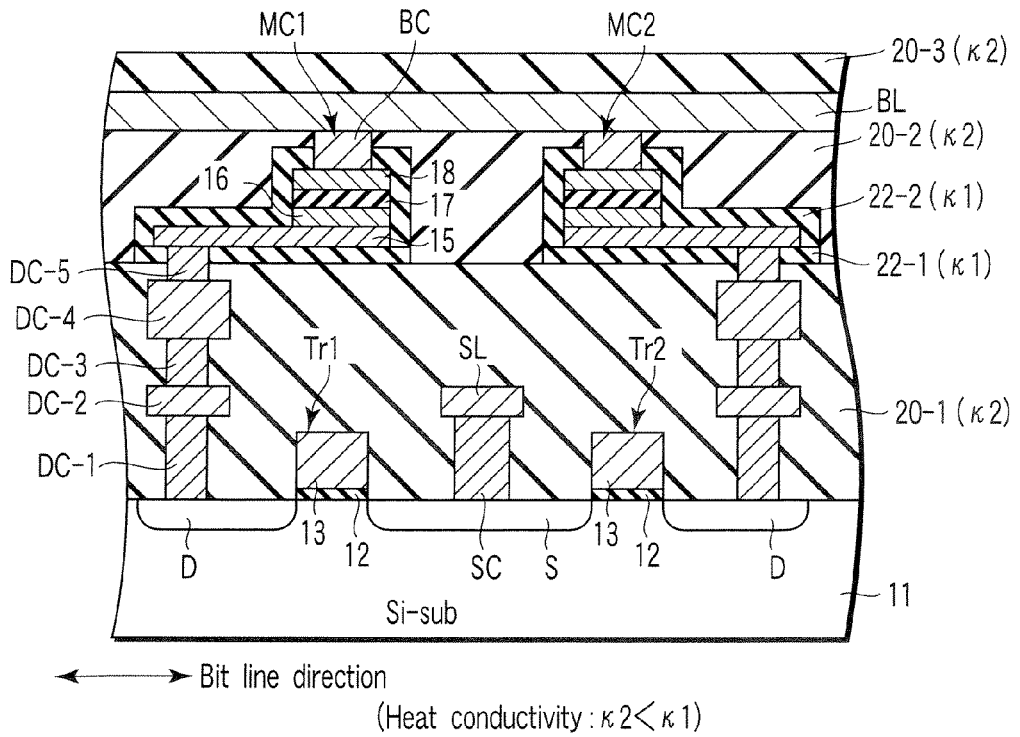
FIG. 1 is a cross-sectional view showing a semiconductor memory device according to a first embodiment of the present invention.

Embodiments of the present invention will now be described with reference to the accompanying drawings. In the description below, common parts are denoted by like reference numerals throughout the drawings.

First Embodiment

An Example of an MRAM of a Spin-Injection Write Scheme

To begin with, a semiconductor memory device according to a first embodiment of the present invention is described with reference to FIG. 1. FIG. 1 is a cross-sectional view showing the semiconductor memory device according to this embodiment. In this embodiment, a 1Tr1MTJ-type MRAM of a spin-injection write scheme is described by way of example.

As shown in FIG. 1, the MRAM includes an MTJ element (magnetic memory element) MC1 having a current path, one end of which is connected to a bit line BL, and an MTJ element MC2 which neighbors the MTJ element MC1 along the bit line BL and has a current path, one end of which is connected to the bit line BL.

Protection insulation films 22-1 and 22-2 (heat conductivity $\kappa 1$) are provided so as to cover the surfaces of the MTJ elements MC1 and MC2. An interlayer insulation film 20-2 (heat conductivity $\kappa 2$) is provided so as to fill the gap between the neighboring MTJ elements MC1 and MC2.

The heat conductivity $\kappa 2$ of the interlayer insulation film 20-2 is lower than the heat conductivity $\kappa 1$ of the protection insulation film 22-1, 22-2 ($\kappa 2 < \kappa 1$). For example, the heat conductivity $\kappa 2$ is about $1/10$ of the heat conductivity $\kappa 1$. The heat conductivity $\kappa 1$, $\kappa 2$ is defined by [W/mK] (W: weight, m: length, K: temperature). Interlayer insulation films 20-1 to 20-3 are formed of, e.g. a porous $SiO_2$ film or a porous Low-k insulation film. The protection insulation film 22-1, 22-2 is formed of, e.g. an SiN film or an $SiO_2$ film.

Each of the MTJ elements MC1 and MC2 includes a pinned layer 16, a tunneling barrier layer 17 and a free layer 18, which are successively provided on an electrically conductive layer 15. One end of the current path of the MTJ element MC1, MC2 is electrically connected to a bit line BL via a bit line contact BC. The other end of the current path of the MTJ element MC1, MC2 is electrically connected to a drain D of a transistor Tr1, Tr2 via drain contacts DC1 to DC5.

Each of the transistors Tr1 and Tr2 comprises a gate insulation film 12 which is provided in the interlayer insulation film 20-1 and is provided on a silicon substrate 11, a gate electrode 13 which is provided on the gate insulation film 12, and a source S and a drain D which are provided spaced apart in the substrate 11 so as to sandwich the gate electrode 13. The transistors Tr1 and Tr2 have their sources S shared, and a source line contact SC is provided on the shared source S. A source line SL is provided on the source line contact SC. The interlayer insulation film 20-3 is provided on the bit line BL.

<Write Operation/Read Operation>

Next, a write operation and a read operation of the semiconductor memory device according this embodiment are explained by taking the MTJ element MC1 as an example.

The write operation is first described. If the transistor Tr1 is turned on to let a current flow from the drain D side to the bit line BL side, electrons which are spin-polarized (spin-polarized electrons) occur in the fixed layer 16. The spin-polarized electrons act on the free layer 18 and reverse the spin of the free layer 18. As a result, the magnetization state of the pinned layer 16 and free layer 18 is changed, for example, from a parallel state to an antiparallel state, and information "0" written in the MTJ element MC1 is changed to "1".

Conversely, if a current is let to flow from the bit line BL side to the drain D side, spin-polarized electrons similarly act on the free layer 18 and reverses the spin of the free layer 18. As a result, the magnetization state of the pinned layer 16 and free layer 18 is changed, for example, from an antiparallel state to a parallel state, and information "1" written in the MTJ element MC1 is changed to "0".

At the time of the write operation, current-passage heat is produced by a relatively large write current that passes through the MTJ element MC1. It is known that the current-passage heat assists in reversing the spin of the free layer 18 ("heat-assist effect"). If the current-passage heat conducts to the neighboring non-selected MTJ element MC2, the spin of the non-selected MTJ element MC2 would be reversed by the heat-assist effect and erroneous write (disturb) would occur. In this embodiment, however, the interlayer insulation films 20-1 and 20-2 having a low heat conductivity $\kappa 2$ are provided so as to fill the gap between the neighboring MTJ elements MC1 and MC2. This prevents erroneous write in the non-selected MTJ element MC2 due to the current-passage heat.

On the other hand, from the standpoint of the write operation speed, it is desirable to quickly radiate the current-passage heat of the selected cell MC1 after the write operation is completed, thus bringing the temperature of the selected cell MC1 into an equilibrium state. The reason is that the residual current-passage heat is considered to conversely assist in hindering re-write. In this embodiment, however, the protection insulation films 22-1 and 22-2 having a high heat conductivity $\kappa 1$ are provided so as to cover the surface of the MTJ element MC1. Thus, the current-passage heat is radiated from the selected cell MTJ element MC1 to the outside, and a decrease in write speed is prevented.

In the read operation, a sense current is supplied to the MTJ element MC1 in which the above-mentioned information "1" or "0" is written, and the written information is read by detecting a variation in resistance due to the TMR effect from the bit line BL. The above-described write operation and read operation are similarly applicable to the MTJ element MC2.

Next, referring to FIG. 2 to FIG. 6, a method of manufacturing the semiconductor memory device according to the present embodiment is described, taking the semiconductor memory device shown in FIG. 1 as an example.

Figure 2:
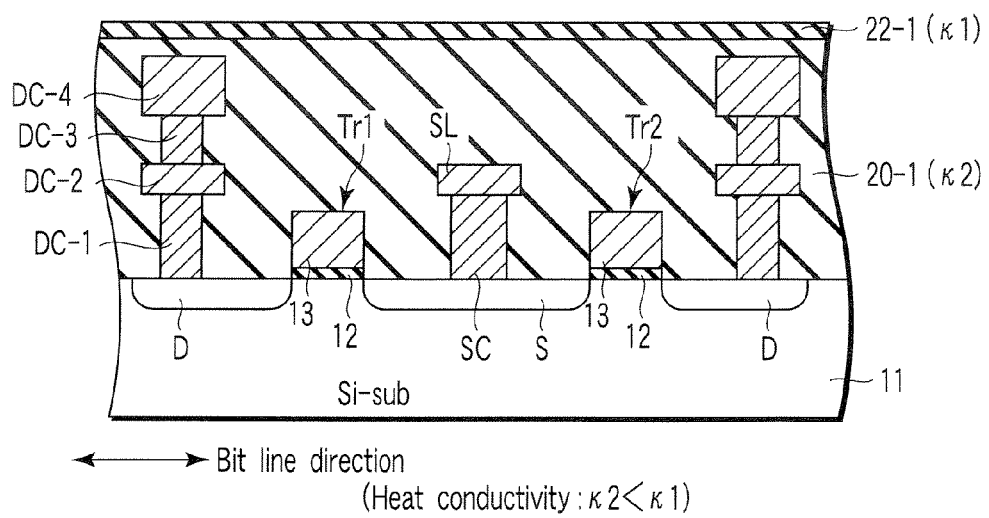
FIG. 2 is a cross-sectional view illustrating a fabrication step of the semiconductor memory device according to the first embodiment.

To start with, as shown in FIG. 2, using a well-know fabrication process, transistors Tr1 and Tr2 are formed on a semiconductor substrate 11. A porous $SiO_2$ film, for instance, which has a low heat conductivity, is deposited by, e.g. CVD (Chemical Vapor Deposition), so as to cover gate electrodes 13 of the transistors Tr1 and Tr2, and thus an interlayer insulation film 20-1 (heat conductivity κ2) is formed. Subsequently, using a well-known fabrication step, drain contacts DC-1 to DC-4, a source contact SC and a source line SL are formed in the interlayer insulation film 20-1. An SiN film, for instance, which has a higher heat conductivity than the interlayer insulation film 20-1, is formed by, e.g. CVD, and thus a protection insulation film 22-1 (heat conductivity κ1) is formed (heat conductivity: κ2<κ1).

Following the above, as shown in FIG. 3, a drain contact DC-5 is formed in the interlayer insulation film 20-1 and protection insulation film 22-1 on the drain contact DC-4. A stacked structure, in which a Cu layer 15, a CoFe layer 16, a Cu layer 17 and a CoFe layer 18, or in which a Ta layer 15, a CoFeB layer 16, a MgO layer 17 and a CoFeB layer 18 are successively stacked, is formed on the protection insulation layer 22-1 and drain contact DC-5 by, e.g. CVD.

As shown in FIG. 4, a photoresist is coated on the CoFe layer 18, and the photoresist is exposed and developed (not illustrated). Using the photoresist as a mask, anisotropic etching, such as RIE (Reactive Ion Etching), is carried out down to a level of the surface of the interlayer insulation film 20-1, thereby isolating the stacked structure in units of a cell and forming MTJ elements MC1 and MC2.

Figure 5:
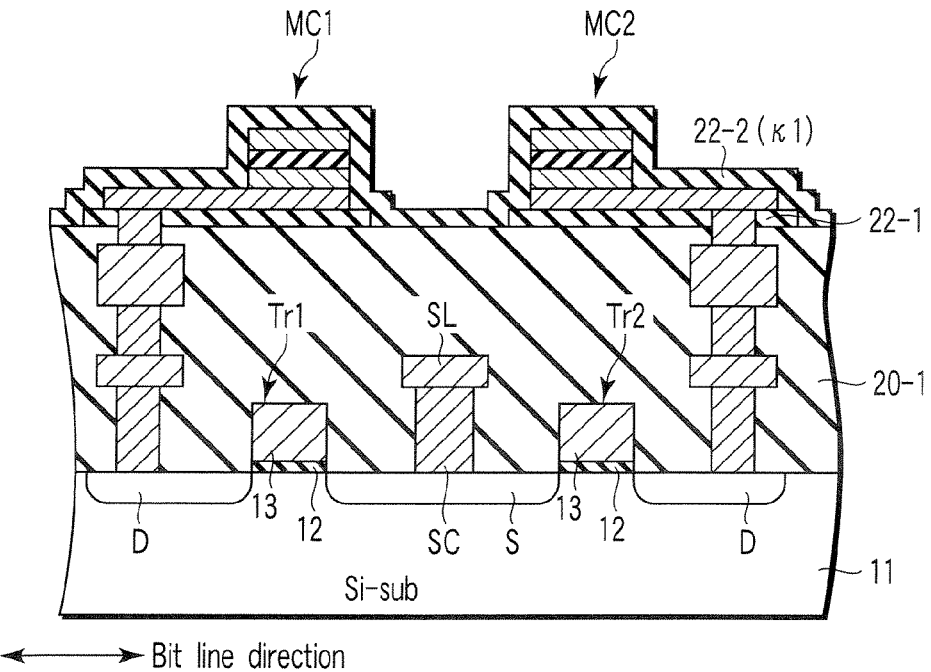
FIG. 5 is a cross-sectional view illustrating a fabrication step of the semiconductor memory device according to the first embodiment.

Subsequently, as shown in FIG. 5, an SiN film, for instance, is deposited by, e.g. CVD, on the upper surfaces and side walls of the MTJ elements MC1 and MC2 and on the interlayer insulation film 20-1, and thus a protection insulation film 22-1 (heat conductivity κ1) is formed.

Figure 6:
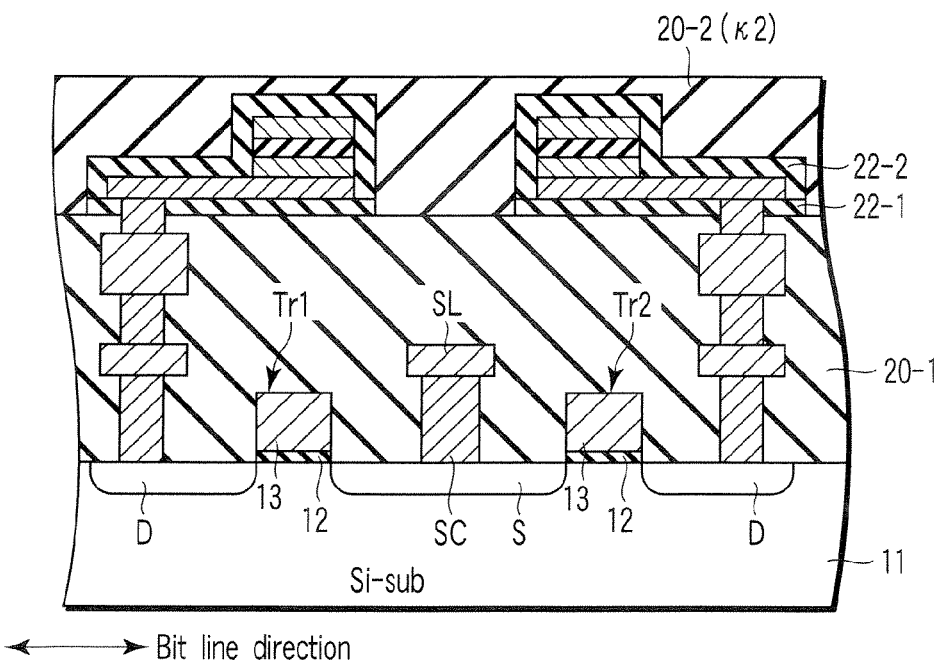
FIG. 6 is a cross-sectional view illustrating a fabrication step of the semiconductor memory device according to the first embodiment.

As shown in FIG. 6, using, e.g. photolithography, the protection insulation film 22-2 is separated in association with the individual MTJ elements MC1 and MC2. On the protection insulation film 22-2 and interlayer insulation film 20-1, a porous $SiO_2$ film is deposited by, e.g. CVD and an interlayer insulation film 20-2 (heat conductivity κ2) is formed.

Using a well-known fabrication step, a bit line contact BC is formed on the free layer 18, and a bit line BL is formed on the interlayer insulation film 20-2 and bit line contact BC. Thereafter, a porous $SiO_2$ film is deposited by, e.g. CVD, on the bit line BL, and an interlayer insulation film 20-3 (heat conductivity κ2) is formed. By the above-described process, the semiconductor memory device shown in FIG. 1 is manufactured.

According to the semiconductor memory device and the manufacturing method thereof according to this embodiment, the following advantageous effects (1) to (4) are obtained.

(1) Heat conduction of current-passage heat to a non-selected cell is prevented, and erroneous write (disturb) in the non-selected cell can advantageously be prevented.

At the time of the write operation, current-passage heat occurs due to a relatively large write current that passes through the MTJ element MC1. If the current-passage heat conducts to the neighboring non-selected MTJ element MC2, the spin of the non-selected MTJ element MC2 is also reversed by the heat-assist effect, leading to erroneous write (disturb). And the current-passage heat keeps non-selected MTJ element MC2 write disturb.

In the present embodiment, however, the interlayer insulation films 20-1 and 20-2 having a low heat conductivity κ2 are provided so as to fill the gap between the neighboring MTJ elements MC1 and MC2.

Thus, the produced current-passage heat is shut off by the interlayer insulation films 20-1 and 20-2, and the heat conduction to the neighboring non-selected cell MC2 can be prevented. As a result, erroneous write (disturb) in the non-selected cell can advantageously be prevented.

(2) Current-passage heat can quickly be radiated, and degradation in speed of write in a selected cell can advantageously be prevented.

It is considered that the current-passage heat, which remains in the selected cell MC1 after the write operation is completed, would conversely assist in hindering re-write. It is thus desirable to quickly radiate the current-passage heat and to bring the temperature of the selected cell MC1 into an equilibrium state. In this embodiment, the protection insulation films 22-1 and 22-2 having the heat conductivity κ1 are provided so as to cover the surfaces of the MTJ elements MC1 and MC2.

The current passage heat in the selected cell MC1 after the write operation can be conducted to the protection insulation films 22-1 and 22-2 having the heat conductivity κ1 and can quickly be radiated to the outside of the selected MTJ element MC1. Therefore, the degradation in speed of write in the selected cell can advantageously be prevented.

(3) Microfabrication can advantageously be achieved.

The write operation can be performed by using only a single write line, e.g. the bit line BL, which is capable of injecting spin-polarized electrons. Another write line, such as a so-called word line, is needless. As a result, the cell size can be reduced, and microfabrication can advantageously be achieved.

The above-described heat-assist effect becomes more conspicuous as the cell size of the MTJ element MC1, MC2 becomes smaller. By the reduction in cell size, the heat-assist effect can be utilized more efficiently.

(4) Selectivity can be improved.

Since the write operation is executed by direct power supply through the bit line BL alone, half-selection that would occur in the case of a magnetic-field write scheme does not occur. Thus, the thermal fluctuation resistance of the MTJ element MC1, MC2 can be decreased, and the selectivity can advantageously be improved.

Modification 1

Example of a Cross-Point Type MRAM

Next, a semiconductor memory device according to Modification 1 of the invention is described with reference to FIG. 7. Modification 1 relates to a so-called cross-point type MRAM. A detailed description of the parts common to those in the first embodiment is omitted.

Figure 7:
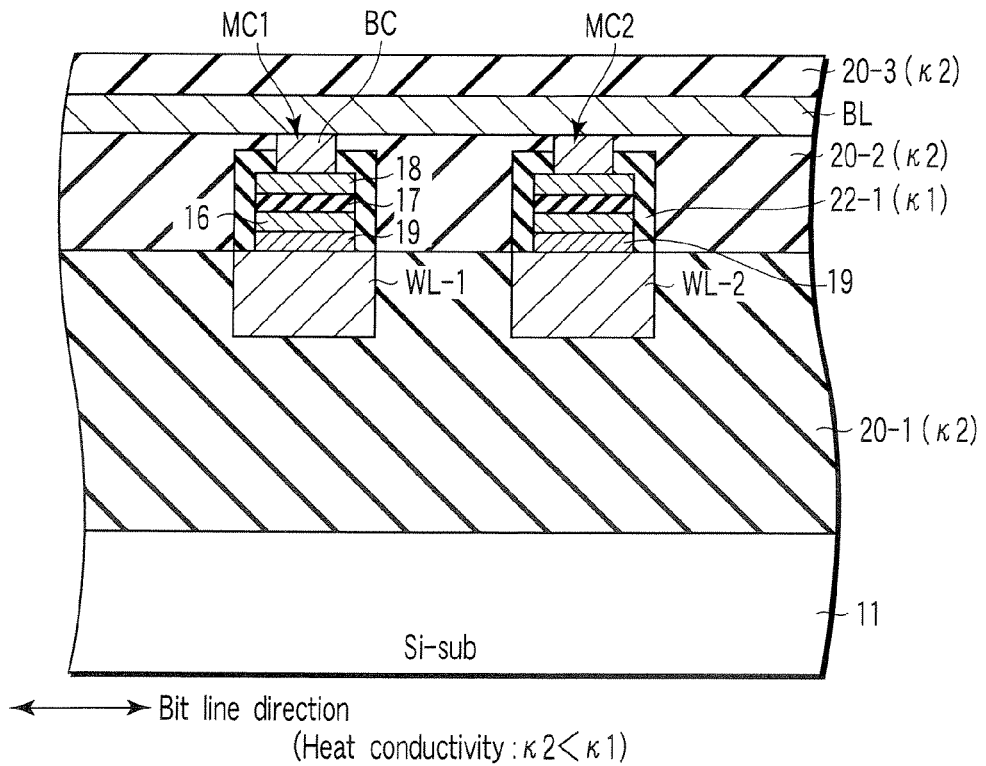
FIG. 7 is a cross-sectional view showing a semiconductor memory device according to Modification 1 of the present invention.

As is shown in FIG. 7, word lines WL-1 and WL-2, which extend in a direction crossing the bit line BL, are provided such that MTJ elements MC1 and MC2 are sandwiched between the bit line BL and the word lines WL-1 and WL-2.

In addition, a diode layer 19 is provided between the pinned layer 16 and word line WL-1, WL-2. In these respects, Modification 1 differs from the first embodiment. Furthermore, Modification 1 differs from the first embodiment in that the transistors Tr1 and Tr2 are not provided on the substrate 11.

The write operation is performed by reversing the spin of the free layer 18 by a compound magnetic field that is generated by a write current that is caused to flow through the bit line BL and word line WL-1, WL-2. The manufacturing method of the semiconductor memory device of Modification 1 is substantially the same as that of the first embodiment, so a detailed description is omitted.

With the semiconductor memory device and the manufacturing method thereof according to Modification 1, the same advantageous effects as the above-described (1) and (2) can be obtained. Further, since the diode layer 19 is provided between the pinned layer 16 and the word line WL-1, WL-2, a so-called detour current can be prevented. Moreover, since the transistors Tr1 and Tr2 are needless, microfabrication can advantageously be achieved. This cross-point type MRAM is applicable, as needed.

Modification 2

Example of a Stacked-Type MRAM

Next, a semiconductor memory device according to Modification 2 of the invention is described with reference to FIG. 8. Modification 2 relates to an example of a stacked-type MRAM which includes another additional layer of the cross-point type MRAM according to Modification 1. A detailed description of the parts common to those in Modification 1 is omitted.

Figure 8:
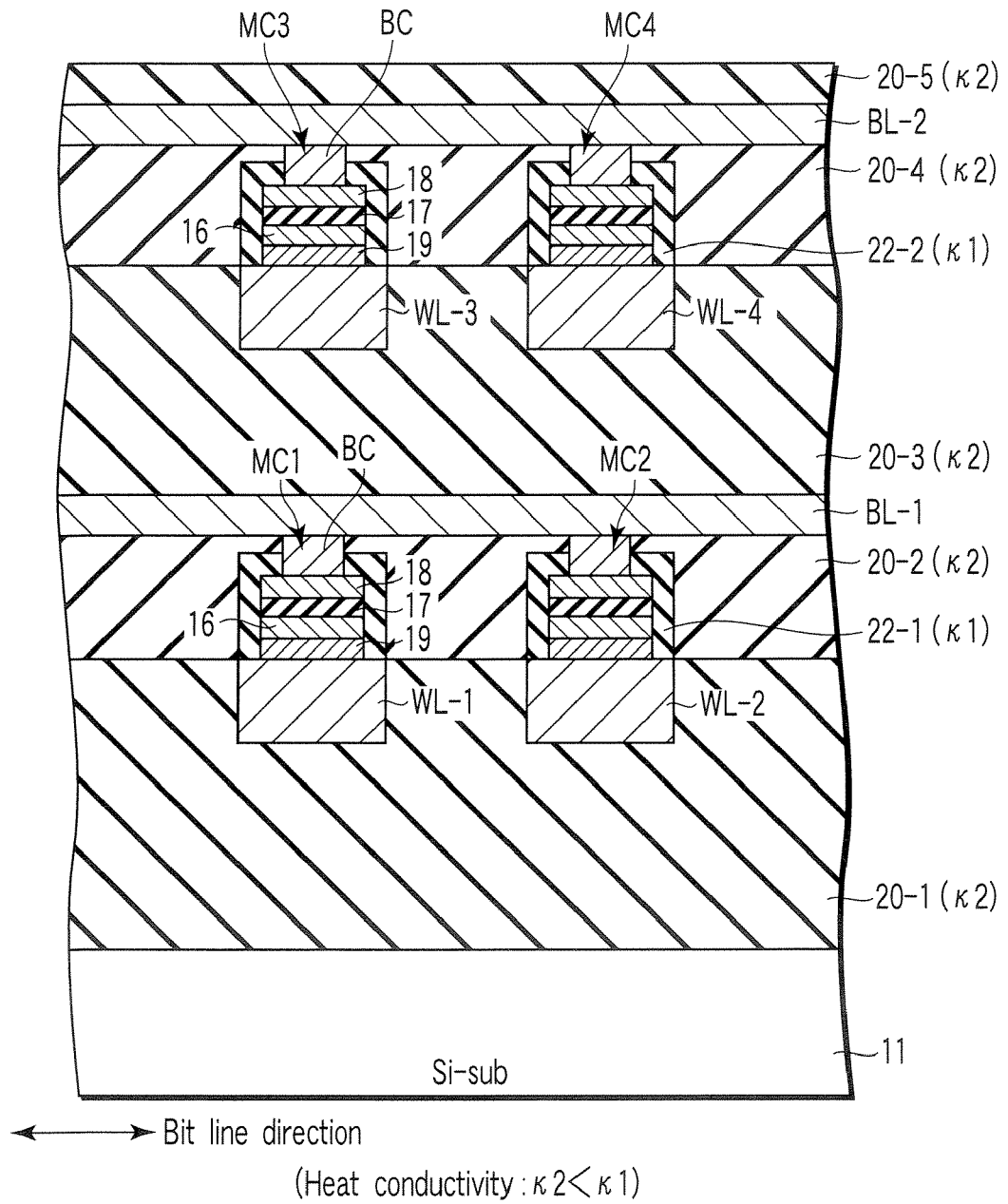
FIG. 8 is a cross-sectional view showing a semiconductor memory device according to Modification 2 of the invention.

As is shown in FIG. 8, the structure of Modification 2 differs from that of Modification 1 in that MTJ elements MC3 and MC4, which are electrically connected to a bit line BL-2, are additionally provided in an interlayer insulation film 20-4 that is stacked on a bit line BL-1.

Like the above-described Modification 1, the MTJ elements MC3 and MC4 are not provided with associated switching transistors. However, by changing the direction of write current that flows through the word line WL-3, WL-4, the direction of generated magnetic field can be changed and the spin of the free layer 18 can be reversed. Thus, a desired write operation can be performed. The manufacturing method of the semiconductor memory device of Modification 2 is substantially the same as that of the first embodiment, so a detailed description is omitted.

With the semiconductor memory device and the manufacturing method thereof according to Modification 2, the same advantageous effects as the above-described (1) and (2) can be obtained.

Further, interlayer insulation films 20-3 and 20-4, which are additionally stacked on the bit line BL-1, have a low heat conductivity $\kappa 2$. Thus, not only heat conduction in the bit line direction but also heat conduction in the vertical direction between the upper and lower stacked parts can be prevented, and erroneous write can advantageously be prevented.

In Modification 2, the MTJ elements MC3 and MC4, which are electrically connected to the bit line BL-2, are additionally provided in the interlayer insulation film 20-4 that is stacked on the bit line BL-1. Thus, while an increase in cell area in the bit line BL direction can be prevented, the memory capacity can advantageously be increased. Specifically, a memory capacity, which is, by simple calculation, about double the memory capacity in the first embodiment, can be obtained.

The number of stacked layers is not limited to two, as in this Modification 2. It is also possible to add a memory array layer including similar MTJ elements. In this case, the memory capacity can advantageously be further increased.

Modification 3

Example of a PRAM

Next, a semiconductor memory device according to Modification 3 of the invention is described with reference to FIG. 9. Modification 3 relates to an example in which a phase change random access memory (PRAM) is applied. A detailed description of the parts common to those in the first embodiment is omitted.

Figure 9:
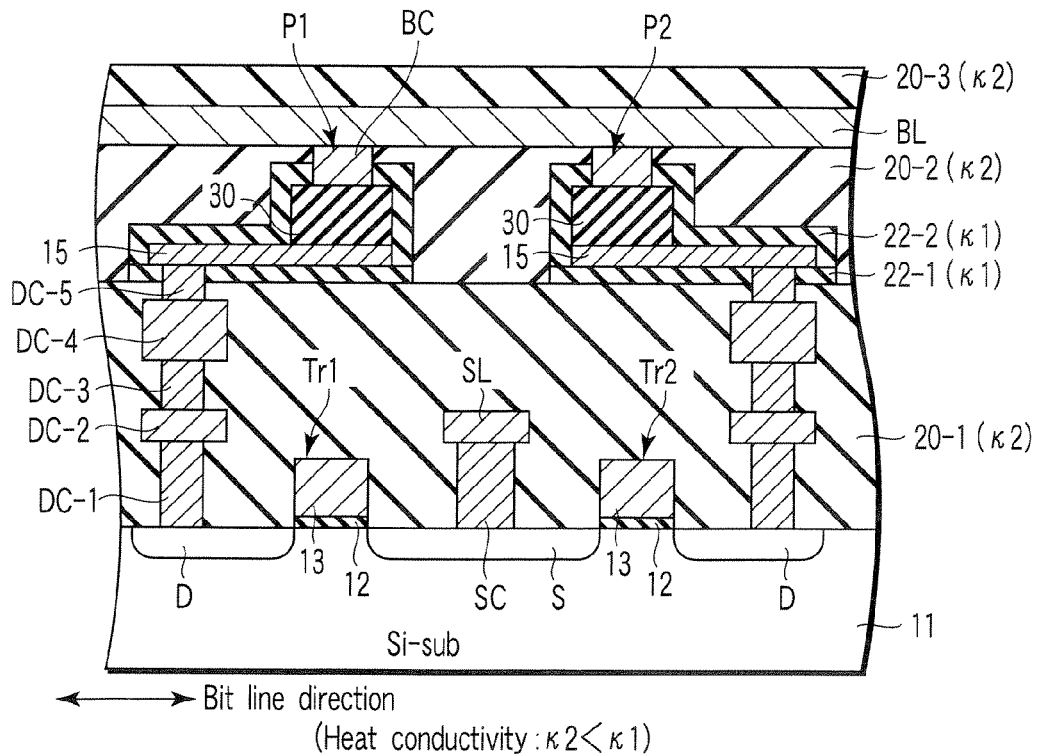
FIG. 9 is a cross-sectional view showing a semiconductor memory device according to Modification 3 of the invention.

As is shown in FIG. 9, Modification 3 differs from the first embodiment in that phase change memory cells P1 and P2, which are electrically connected to the bit line BL, are provided. The phase change memory cell P1, P2, includes a phase change film 30 that is provided between the bit line contact BC and an electrically conductive film 15. The phase change film 30 is formed of, e.g. a chalcogenide film, and the phase of the phase change film 30 changes from a crystalline state to an amorphous state when the temperature of the phase change film 30 varies across a phase change temperature.

The write operation is executed in the following manner. A write current is let to flow between the bit line BL and the drain D, and the temperature of the phase change film 30 is raised up to the phase change temperature by the produced current-passage heat. Thereby, the phase of the phase change film 30 is changed from the crystalline state to amorphous state, or from the amorphous state to crystalline state. Thus, the write operation is completed. The read operation is executed by causing a sense current to flow to the memory cell P1, P2, and detecting from the bit line BL a variation in resistance due to the crystalline state or amorphous state.

The manufacturing method of Modification 3 differs from that of the first embodiment in that, following the formation of the electrically conductive layer 15, a chalcogenide film, for instance, is deposited by, e.g. CVD, on the electrically conductive film 15, thereby forming the phase change film 30.

With the semiconductor memory device and the manufacturing method thereof according to Modification 3, the same advantageous effects as the above-described (1) to (4) can be obtained. As in Modification 3, the invention is applicable to the PRAM, as needed.

Second Embodiment

Next, a semiconductor memory device according to a second embodiment of the invention is described with reference to FIG. 10. A detailed description of the parts common to those in the first embodiment is omitted.

Figure 10:
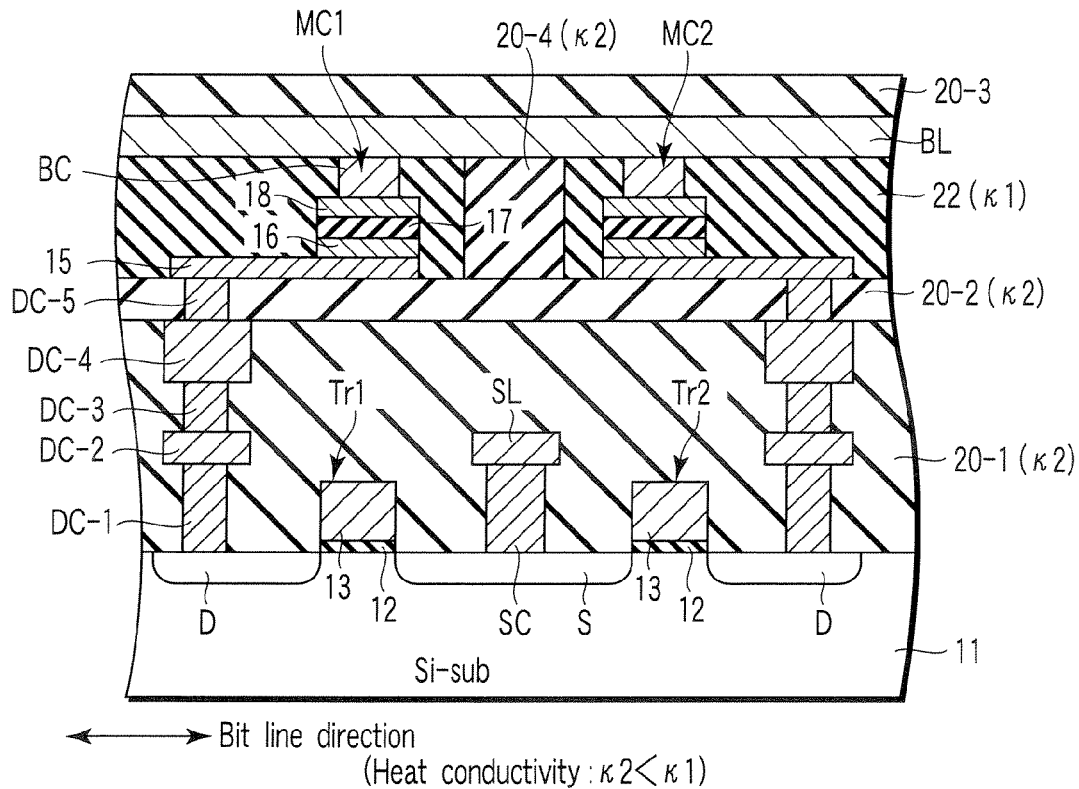
FIG. 10 is a cross-sectional view showing a semiconductor memory device according to a second embodiment of the present invention.

As is shown in FIG. 10, the semiconductor device according to the second embodiment differs from that of the first embodiment in the following respects. The MTJ elements MC1 and MC2 are disposed on an electrically conductive layer 15 which is provided on the interlayer insulation film 20-2. Further, an interlayer insulation film 20-4 is provided on the interlayer insulation film 20-2 so as to isolate the MTJ elements MC1 and MC2 that neighbor in the bit line direction. A protection insulation film 22 is provided so as to fill the gap between the cells MC1 and MC2 at regions other than the region where the interlayer insulation film 20-4 is provided. The heat conductivity $\kappa 2$ of the interlayer insulation film 20-4 is lower than the heat conductivity $\kappa 1$ of the protection insulation film 22 ($\kappa 2 < \kappa 1$).

Figure 11:
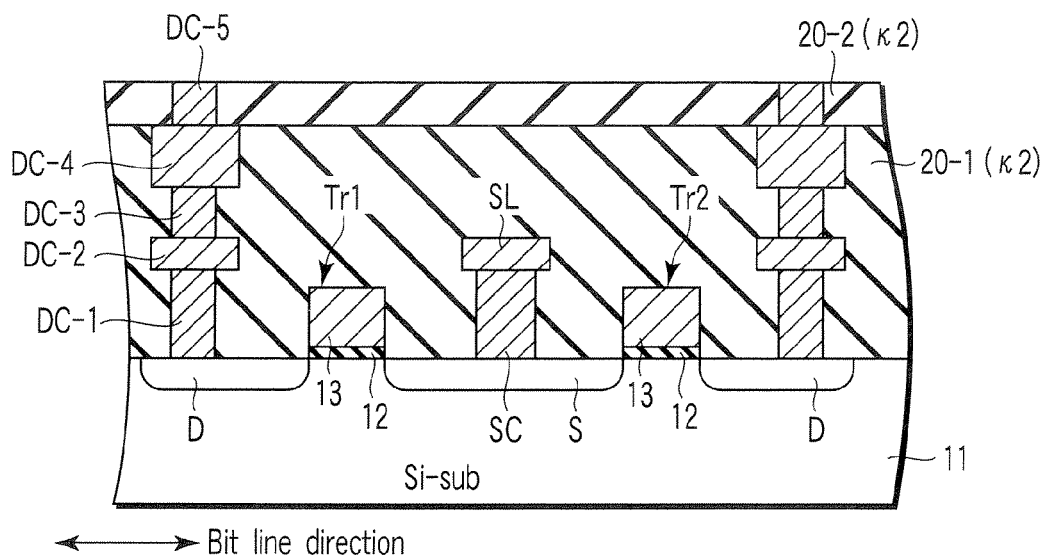
FIG. 11 is a cross-sectional view illustrating a fabrication step of the semiconductor memory device according to the second embodiment.

Next, referring to FIG. 11 to FIG. 13, a method of manufacturing the semiconductor memory device according to the present embodiment is described, taking the semiconductor memory device shown in FIG. 10 as an example.

To start with, as shown in FIG. 11, using a well-know fabrication process, transistors Tr1 and Tr2 are formed on a semiconductor substrate 11. A porous $SiO_2$ film, for instance, which has a low heat conductivity, is deposited by, e.g. CVD, so as to cover gate electrodes 13 of the transistors Tr1 and Tr2, and thus an interlayer insulation film 20-1 (heat conductivity κ2) is formed. Subsequently, using a well-known fabrication step, drain contacts DC-1 to DC-4, a source contact SC and a source line SL are formed in the interlayer insulation film 20-1. Then, a porous $SiO_2$ film, for instance, which has a low heat conductivity, is deposited by, e.g. CVD, on the interlayer insulation film 20-1, and thus an interlayer insulation film 20-2 (heat conductivity κ2) is formed. Subsequently, a drain contact DC-5 is formed in the interlayer insulation film 20-2 on the drain contact DC-4.

As is shown in FIG. 12, using the same fabrication step as in the first embodiment, an electrically conductive film 15, a pinned layer 16, a tunneling barrier layer 17 and a free layer 18 are formed, and thus MTJ elements MC1 and MC2 are formed. Subsequently, an SiN film, for instance, which has a heat conductivity (heat conductivity κ1) higher than the heat conductivity of the interlayer insulation film 20-1, 20-2, is formed by, e.g. CVD, so as to cover the surfaces of the interlayer insulation film 20-2, electrically conductive layer 15 and MTJ elements MC1 and MC2, and thus a protection insulation film 22 is formed (heat conductivity: κ1>κ2).

Using, e.g. photolithography and anisotropic etching such as RIE, a trench (not shown) is formed. The trench penetrates the protection insulation film 22 and reaches the surface of the interlayer insulation film 20-2 so as to separate the neighboring MTJ elements MC1 and MC2.

As shown in FIG. 13, a porous $SiO_2$ film, for instance, which has a low heat conductivity, is buried in the trench by, e.g. CVD, and thus an interlayer insulation film 20-4 (heat conductivity κ2) is formed. Thereafter, using a well-known process, a bit line BL and an interlayer insulation film 20-3 are formed. Thus, the semiconductor memory device shown in FIG. 10 is manufactured.

With the semiconductor memory device and the manufacturing method thereof according to the second embodiment, the same advantageous effects as the above-described (1) to (4) can be obtained.

Further, the protection insulation film 22 having a high heat conductivity is provided so as to fill the region except a region between the cells MC1 and MC2 that neighbor in the bit line BL direction. Compared to the first embodiment in which the protection insulation films 22-1 and 22-2 are provided so as to cover the surfaces of the MTJ elements, the volume of the protection insulation film 22 can be increased. Since the volume of the layer for radiating the current-passage heat is increased, the current-passage heat can be conducted to the protection insulation film 22 having the high heat conductivity κ2 and can be radiated more quickly to the outside of the MTJ element MC1, MC2. As a result, degradation in speed of write in the selected MTJ element MC1, MC2 can advantageously be prevented more effectively.

Third Embodiment

Example of a Structure Including an Air Gap

Next, a semiconductor memory device according to a third embodiment of the invention is described with reference to FIG. 14. The third embodiment relates to an example in which an air gap is provided in an insulation film between neighboring cells. A detailed description of the parts common to those in the first embodiment is omitted.

Figure 14:
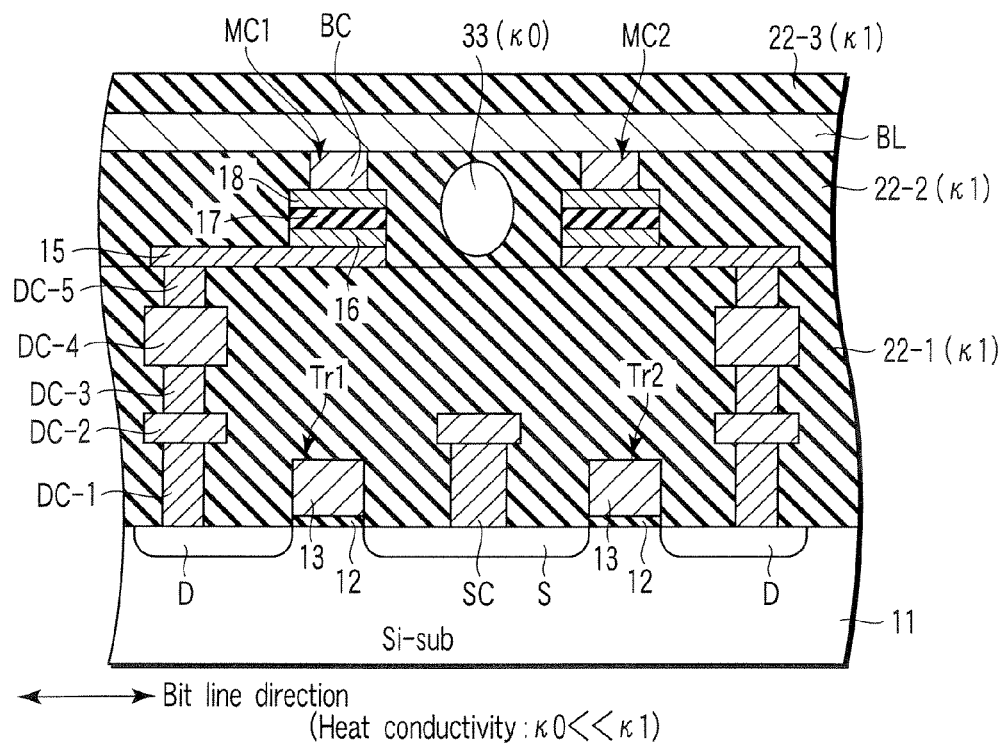
FIG. 14 is a cross-sectional view showing a semiconductor memory device according to a third embodiment of the present invention.

As shown in FIG. 14, the semiconductor memory device according to the third embodiment differs from that of the first embodiment in that an air gap 33 is provided in the protection insulation film 22-2 between the MTJ elements MC1 and MC2 which neighbor along the bit line BL. The heat conductivity κ0 of the air gap 33 is much lower than the heat conductivity κ1 of the protection insulation film 22-1, 22-2 (heat conductivity: κ0<<κ1).

Figure 15:
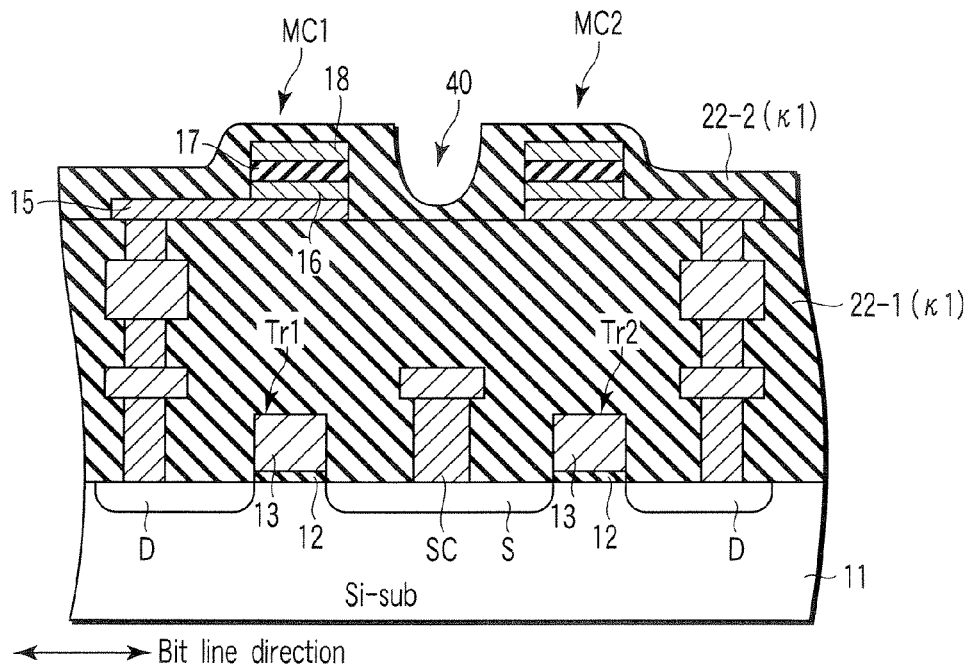
FIG. 15 is a cross-sectional view illustrating a fabrication step of the semiconductor memory device according to the third embodiment.

Next, referring to FIG. 15 and FIG. 16, a method of manufacturing the semiconductor memory device according to the present embodiment is described, taking the semiconductor memory device shown in FIG. 14 as an example.

To start with, as shown in FIG. 15, using a well-know fabrication process, transistors Tr1 and Tr2 are formed on a semiconductor substrate 11. An SiN film, for instance, which has a high heat conductivity, is deposited by, e.g. CVD, so as to cover gate electrodes 13 of the transistors Tr1 and Tr2, and thus a protection insulation film 22-1 (heat conductivity κ1) is formed. Subsequently, using a well-known fabrication step, drain contacts DC-1 to DC-4, a source contact SC and a source line SL are formed in the protection insulation film 22-1. Following the above, a drain contact DC-5 is formed in the protection insulation film 22-1 on the drain contact DC-4. Using the same fabrication process as in the first embodiment, an electrically conductive layer 15, a pinned layer 16, a tunneling barrier layer 17 and a free layer 18 are formed, and thus MTJ elements MC1 and MC2 are formed.

An SiN film, for instance, is deposited by, e.g. CVD, so as to cover the protection insulation film 22-1, electrically conductive layer 15 and the surfaces of the MTJ elements MC1 and MC2, and thus a protection insulation film 22-2 (heat conductivity κ1) is formed. In this step, for example, the conditions for reaction, such as heat and pressure, are chosen so as to intentionally worsen the condition for burying the deposition insulation film 22-2. Thereby, an air gap 40 is formed between the cells of the MTJ elements MC1 and MC2 which neighbor in the bit line direction.

In the fabrication step of the protection insulation film 22-2, not only the CVD but also a high-density plasma method or a sputtering method, for instance, may be used. The conditions for reaction, which are to be chosen, are not limited to the heat and pressure. For example, a deposition gas with less straightness in movement may be chosen.

As shown in FIG. 16, the above deposition step is performed until a top portion of the air gap 40 becomes continuous, and thus the protection insulation film 22-2 is formed. Using substantially the same fabrication process as in the first embodiment, a bit line BL and a protection insulation film 22-3 are formed, and the semiconductor memory device shown in FIG. 14 is manufactured.

With the semiconductor memory device and the manufacturing method thereof according to the third embodiment, the same advantageous effects as the above-described (1) to (4) can be obtained.

Further, in the semiconductor memory device according to this embodiment, the air gap 33 is provided in the protection insulation film 22-2 between the MTJ elements MC1 and MC2 which neighbor along the bit line BL. The heat conductivity κ0 of the air gap 33 is much lower than the heat conductivity κ1 of the protection insulation film 22-2 (heat conductivity: κ0<<κ1).

Thus, the produced current-passage heat is shut off by the air gap 33, and the heat conduction to the neighboring non-selected cell MC2 can be prevented. As a result, erroneous write (disturb) in the non-selected cell can advantageously be prevented.

Fourth Embodiment

Example of MRAM with Divided Write Lines

Next, a semiconductor memory device according to a fourth embodiment of the invention is described with reference to FIG. 17. The fourth embodiment relates to an example of a cross-point type MRAM in which one of lines for write is divided into a line for write and a line for read. A detailed description of the parts common to those in the first embodiment is omitted.

As shown in FIG. 17, the fourth embodiment differs from the first embodiment in that a word line is electrically divided in the bit line direction into a word line WL1-1 and a second word line WL1-2.

The first word line WL1-1 is electrically connected to one end of the current path of the MTJ element MC1, and functions as a read line. The second word line WL1-2 is provided in the word line direction such that the MTJ element MC1 is interposed between the bit line BL and the second word line WL1-2, and the second word line WL1-2 functions as a write line so as to reverse the spin of the free layer 18 by a generated magnetic field.

With the semiconductor memory device and the manufacturing method thereof according to the fourth embodiment, the same advantageous effects as the above-described (1) to (4) can be obtained. The structure of this embodiment is applicable, as needed.

Fifth Embodiment

Example of Vertical Magnetization Films

Next, a semiconductor memory device according to a fifth embodiment of the invention is described with reference to FIG. 18 and FIG. 19. The fifth embodiment relates to an example in which vertical magnetization films are applied to the free layer and pinned layer. A detailed description of the parts common to those in the first embodiment is omitted.

Figure 18:
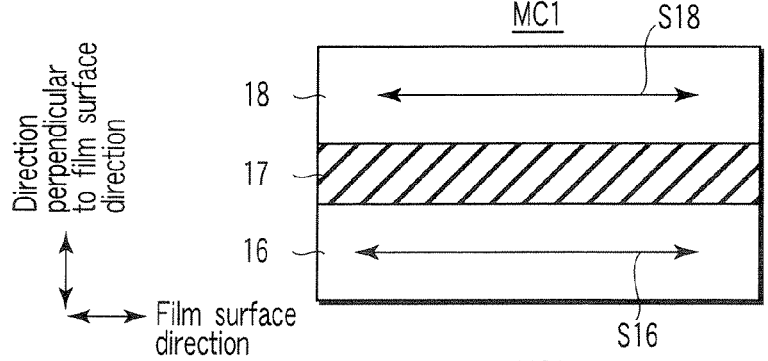
FIG. 18 is a cross-sectional view showing a semiconductor memory device according to a fifth embodiment of the present invention.

As shown in FIG. 18, a direction S16 of the spin of the pinned layer 16 of the MTJ element MC1 and a direction S18 of the spin of the free layer 18 of the MTJ element MC1 are, in general, film-surface directions.

Figure 19:
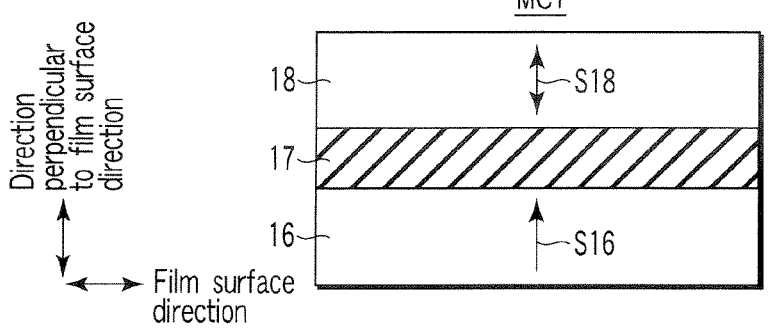
FIG. 19 is a cross-sectional view showing the semiconductor memory device according to the fifth embodiment of the present invention.

However, as shown in FIG. 19, if the pinned layer 16 and free layer 18 are formed of magnetic materials, which are selected as will be described below, the directions S16 and S18 of the spin can be set in directions perpendicular to the film-surface direction.

Examples of materials of the pinned layer 16 and free layer 18, which can produce vertical magnetization, will be described below in greater detail.

Materials

[A] Examples of Magnetic Materials Having High Coercivity

As a primary condition, magnetic materials of the pinned layer 16 and free layer 18, which can produce vertical magnetization, need to have high coercivity. It is desirable that the magnetic material has, as a high coercivity, a high magnetic anisotropic energy density of, e.g. $1 \times 10^6$ erg/cc.

Examples of such materials of the pinned layer 16 and free layer 18 are listed below.

(A-1) Example 1

An alloy including at least one of Fe (iron), Co (cobalt) and Ni (nickel), and at least one of Cr (chromium), Pt (platinum) and Pd (palladium).

Examples of ordered alloys are Fe(50)Pt(50), Fe(50)Pd(50) and Co(50)Pt(50). Examples of disordered alloys are CoCr alloy, CoPt alloy, CoCrPt alloy, CoCrPtTa alloy and CoCrNb alloy.

(A-2) Example 2

A structure in which at least one of Fe, Co and Ni or an alloy including one of Fe, Co and Ni, and at least one of Pd and Pt or an alloy including one of Pd and Pt are alternately stacked.

Examples are a Co/Pt artificial lattice, a Co/Pd artificial lattice, and a CoCr/Pt artificial lattice. In cases where the Co/Pt artificial lattice is used and the Co/Pd artificial lattice is used, a high value of a resistance variation ratio (MR ratio), which is about 40%, can be realized.

(A-3) Example 3

An amorphous alloy comprising at least one of rare earth metals, e.g. Tb (terbium), Dy (dysprosium) and Gd (gadolinium), and at least one of transition metals.

Examples are TbFe, TbCo, TbFeCo, DyTbFeCo, and GdTbCo.

[B] Examples of Material of Free Layer 18

It is possible to form the free layer 18 of the above-described magnetic material with high coercivity. However, it is also possible to form the free layer 18 of a magnetic material having a lower magnetic anisotropic energy density than the above-described magnetic material with high coercivity, for example, by adjusting the composition ratio, adding impurities, or adjusting the thickness of the layer.

Examples of the material of the free layer 18 are listed below.

(B-1) Example 1

An alloy in which impurities are added to an alloy including at least one of Fe, Co and Ni and at least one of Cr, Pt and Pd.

Examples of ordered alloys are Fe(50)Pt(50), Fe(50)Pd(50) and Co(50)Pt(50), to which impurities, such as Cu, Cr or Ag, are added, thereby to decrease a magnetic anisotropic energy density. Examples of disordered alloys are CoCr alloy, CoPt alloy, CoCrPt alloy, CoCrPtTa alloy and CoCrNb alloy, in which the ratio of a non-magnetic element is increased, thereby to decrease a magnetic anisotropic energy density.

(B-2) Example 2

A structure in which at least one of Fe, Co and Ni or an alloy including one of Fe, Co and Ni, and at least one of Pd and Pt or an alloy including one of Pd and Pt are alternately stacked, the thickness of a layer of the former element or alloy or the thickness of a layer of the latter element or alloy being adjusted.

There is an optimal value of the thickness of at least one of Fe, Co and Ni or the alloy including one of Fe, Co and Ni, and there is an optimal value of the thickness of at least one of Pd and Pt or the alloy including one of Pd and Pt. As the value of the thickness deviates farther from the optimal value, the magnetic anisotropic energy density gradually decreases.

(B-3) Example 3

An amorphous alloy comprising at least one of rare earth metals, e.g. Tb (terbium), Dy (dysprosium) and Gd (gadolinium), and at least one of transition metals, the composition ratio of the amorphous alloy being adjusted.

Examples are amorphous alloys such as TbFe, TbCo, TbFeCo, DyTbFeCo, and GdTbCo, the composition ratio of which is adjusted to decrease the magnetic anisotropic energy density.

[C] Example in which a Yoke Material (Soft Magnetic Material) is Applied

In a case where an MTJ element MC is formed on a yoke material (soft magnetic material), a buffer layer, which has a function of preventing diffusion of atoms and a function of preventing exchange bonding between the yoke material and the MTJ element MC, is provided between the yoke material and the MTJ element MC. The buffer layer is formed of an electrically conductive layer of, e.g. Ta, TiN or TaN.

Examples of the materials of the pinned layer 16 and free layer 18 are listed below.

In a case where an ordered alloy of, e.g. FePt or CoPt is used for the pinned layer 16, an fct(001) plane needs to be oriented in order to generate vertical magnetic anisotropy. It is thus preferable to use, as a crystal orientation control layer, a very thin underlayer which is formed of MgO with a thickness of about several nm. Other than MgO, usable examples are elements and compounds with an fcc structure or a bcc structure having a lattice constant of about 2.8 Å, 4.0 Å or 5.6 Å, such as Pt, Pd, Ag, Au, Al, Cu, Cr, and Fe, or alloys thereof. In the case of a bottom-pin structure, a crystal orientation control layer may be disposed between the yoke material and the pinned layer. A buffer layer formed of, e.g. Ta, TiN or TaN may be disposed between the crystal orientation control layer and the yoke material. In the case of a top-pin structure, it is preferable to use MgO with an oriented fcc (100) plane for the barrier layer. In this case, the above-described crystal orientation control layer may be additionally stacked to such an extent that no degradation occurs in MR.

In the case of using, for example, a Co/Pt artificial lattice as the free layer 18, the coercivity of the MTJ element can be adjusted by adjusting the thickness of Co and Pt.

Similarly, in the case of an ordered alloy of, e.g. FePt or CoPt for the free layer 18, an fct(001) plane needs to be oriented. In the case of a top-pin (bottom-free) structure, a crystal orientation control layer may be disposed between the yoke material and the pinned layer 16. A buffer layer formed of, e.g. Ta, TiN or TaN may be disposed between the crystal orientation control layer and the yoke material. In the case of a bottom-pin (top-free) structure, it is preferable to use MgO with an oriented fcc (100) plane for the barrier layer. In this case, the above-described crystal orientation control layer may be additionally stacked to such an extent that no degradation occurs in MR.

The manufacturing method of the semiconductor memory device of this embodiment is substantially the same as that of the first embodiment, so a detailed description is omitted.

With the semiconductor memory device and the manufacturing method thereof according to the fifth embodiment, the same advantageous effects as the above-described (1) to (4) can be obtained. The structure of this embodiment is applicable, as needed.

Sixth Embodiment

Example of Double-Junction Structure

Next, a semiconductor memory device according to a sixth embodiment of the invention is described with reference to FIG. 20 and FIG. 21. The sixth embodiment relates to an example of an MRAM having a double-junction structure in which a free layer 18 is interposed between tunneling barrier layers 17-1 and 17-2 and pinned layers 16-1 and 16-2. A detailed description of the parts common to those in the fifth embodiment is omitted.

Figure 20:
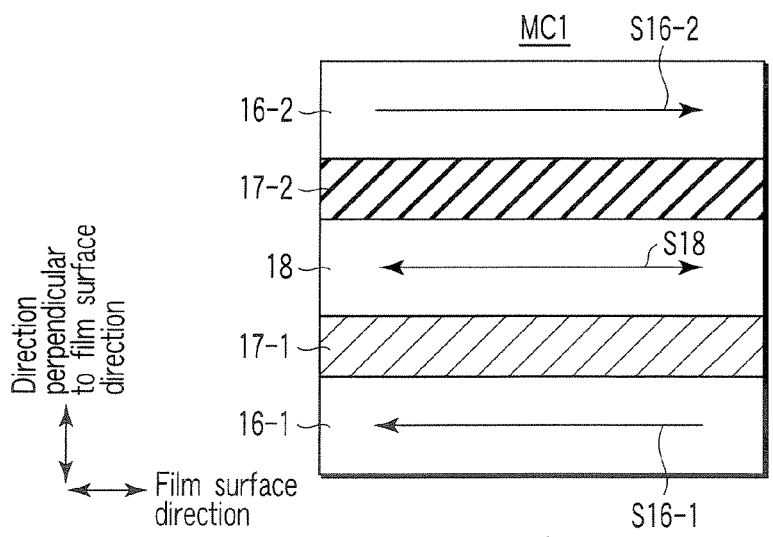
FIG. 20 is a cross-sectional view showing a semiconductor memory device according to a sixth embodiment of the present invention.

An MTJ element MC1 shown in FIG. 20 has an example of a double-junction structure in which the directions of spin of the free layer 18 and pinned layers 16-1 and 16-2 are film-surface directions. As shown in FIG. 20, directions S16-1 and S16-2 of the pinned layers 16-1 and 16-2 are fixed to be opposite to each other in the film-surface direction.

Figure 21:
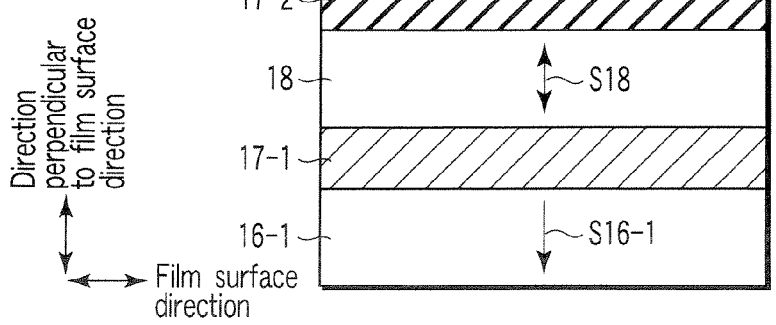
FIG. 21 is a cross-sectional view showing the semiconductor memory device according to the sixth embodiment of the present invention.

An MTJ element MC1 shown in FIG. 21 has an example of a double-junction structure in which the directions of spin of the free layer 18 and pinned layers 16-1 and 16-2 are perpendicular to the film-surface direction. As shown in FIG. 21, directions S16-1 and S16-2 of the pinned layers 16-1 and 16-2 are fixed in the same direction perpendicular to the film-surface direction. The materials and structures, which are described in the above sections [A] to [C], are applicable to the free layer 18 and pinned layers 16-1 and 16-2 shown in FIG. 21.

The sixth embodiment differs from the fifth embodiment in the following respects. First, the tunneling barrier layer 17-2 is further provided on the free layer 18, and the pinned layer 16-2 is further provided on the tunneling barrier layer 17-2.

Second, the tunneling barrier layer 17-2 is formed of an insulating film of, e.g. MgO or $Al_2O_3$, whereas the other tunneling barrier layer 17-1 is formed of an electrically conductive film of, e.g. Cu or Ru.

The reason for this is as follows. In the present embodiment, the write current is reduced by making use of reflection of spin electrons. However, if the directions S16-1 and S16-2 of spin of the pinned layers 16-1 and 16-2 are fixed as shown in the Figures, the magnetoresistances (MR) of both junctions would be mutually canceled. It is thus necessary to use an electrically conductive film for the tunneling barrier film 17-1 (spacer layer) of one of the junctions, thereby to eliminate the magnetoresistance (MR) of the other junction.

The manufacturing method of the semiconductor memory device of this embodiment is substantially the same as that of the first embodiment, so a detailed description is omitted.

With the semiconductor memory device and the manufacturing method thereof according to the sixth embodiment, the same advantageous effects as the above-described (1) to (4) can be obtained. The double-junction structure of this embodiment is applicable, as needed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a first write line which is provided in a first direction;
a first memory element which is connected to the first write line;
a second memory element which is provided to neighbor the first memory element in the first direction, and is connected to the first write line;
a first insulation film which is provided on surfaces of the first and second memory elements; and
a second insulation film which is provided between the neighboring first and second memory elements and has a lower heat conductivity than the first insulation film,
wherein each of the first and second memory elements is a magnetic memory element of a spin injection write scheme, which includes at least a free layer which is electrically connected to the first write line, a first pinned layer, and a first tunneling barrier layer which is provided between the free layer and the first pinned layer.

2. The device according to claim 1, wherein the first insulation film includes at least one of an SiN film and an $SiO_2$ film, and
the second insulation film includes at least a porous insulation film.

3. The device according to claim 1, further comprising:
first and second transistors which are provided in the second insulation film and have current paths which are commonly connected at one end and are electrically connected at the other end to the first and second memory elements, respectively.

4. The device according to claim 1, further comprising:
second write lines which are disposed in a second direction crossing the first write line such that the first and second memory elements are interposed between the first write line and the second write lines, respectively; and
diode layers which are provided between the first and second memory elements and the second write lines, respectively.

5. The device according to claim 4, further comprising:
a third write line which is provided in the first direction;
a third memory element which is connected to the third write line;
a fourth memory element which is provided to neighbor the third memory element in the first direction, and is connected to the third write line;
a third insulation film which is provided on surfaces of the third and fourth memory elements; and
a fourth insulation film which is provided between the neighboring third and fourth memory elements and on the third write line and has a lower heat conductivity than the third insulation film.

6. The device according to claim 5, further comprising:
fourth write lines which are disposed in the second direction such that the third and fourth memory elements are interposed between the third write line and the fourth write lines, respectively; and
diode layers which are provided between the third and fourth memory elements and the fourth write lines, respectively.

7. The device according to claim 1, further comprising:
a third insulation film which is provided between the first and second memory elements and has a lower heat conductivity than the first insulation film.

8. The device according to claim 1, further comprising:
a first line which is disposed in a second direction crossing the first write line such that the first memory element is interposed between the first write line and the first line, the first line being electrically connected to one end of a current path of the first memory element, the first line functioning as a read line;
a second line which is disposed in the second direction such that the first memory element is interposed between the first write line and the second line, the second line functioning as a write line; and a diode layer which is electrically connected to the first line.

9. The device according to claim 1, the first memory element comprising:
a direction of spin of the free layer crossing a film surface direction of the free layer; and
a direction of spin of the first pinned layer crossing a film surface direction of the first pinned layer.

10. The device according to claim 9, wherein the first memory element further comprises:
a second pinned layer, a direction of spin of the second pinned layer crossing a film surface direction of the second pinned layer; and
a second tunneling barrier layer which is provided between the free layer and the second pinned layer.

11. The device according to claim 10, wherein the first tunneling barrier layer is formed of an electrically conductive film, and
the second tunneling barrier layer is formed of an insulation film.

* * * * *